(12) United States Patent
Gao

(10) Patent No.: US 10,571,768 B2
(45) Date of Patent: Feb. 25, 2020

(54) PIXEL ARRAY, DISPLAY PANEL AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventor: Yujie Gao, Beijing (CN)

(73) Assignees: BOE Technology Group Co., Ltd., Beijing (CN); Beijing BOE Display Technology Co., Ltd., Beijing (CN)

( * ) Notice: Subject to any disclaimer, the term of this patent is extended or adjusted under 35 U.S.C. 154(b) by 11 days.

(21) Appl. No.: 15/744,214

(22) PCT Filed: Jul. 13, 2017

(86) PCT No.: PCT/CN2017/092778
§ 371 (c)(1),
(2) Date: Jan. 12, 2018

(87) PCT Pub. No.: WO2018/054137
PCT Pub. Date: Mar. 29, 2018

(65) Prior Publication Data
US 2019/0004383 A1   Jan. 3, 2019

(30) Foreign Application Priority Data

Sep. 23, 2016   (CN) .......................... 2016 1 0849268

(51) Int. Cl.
*G02F 1/1362*   (2006.01)
*H01L 27/12*   (2006.01)
(Continued)

(52) U.S. Cl.
CPC ..... *G02F 1/136286* (2013.01); *G09G 3/3648* (2013.01); *H01L 27/124* (2013.01);
(Continued)

(58) Field of Classification Search
CPC ............ G02F 1/136286; G09G 3/3648; H01L 27/124
See application file for complete search history.

(56) References Cited

U.S. PATENT DOCUMENTS

2012/0320297 A1 * 12/2012 Itsumi .................. G09G 3/3648
349/43
2013/0335654 A1   12/2013 Chen et al.
(Continued)

FOREIGN PATENT DOCUMENTS

CN   101216650 A   7/2008
CN   101221337 A   7/2008
(Continued)

OTHER PUBLICATIONS

International Search Report and Written Opinion dated Oct. 19, 2017; PCT/CN2017/092778.
(Continued)

*Primary Examiner* — Bilkis Jahan
*Assistant Examiner* — Victor V Barzykin
(74) *Attorney, Agent, or Firm* — Ladas & Parry LLP; Hermine Valizadeh

(57) ABSTRACT

Disclosed are a pixel array, a display panel and a display device. The pixel array includes: a plurality of pixel units arranged in an array, a plurality of data lines and a plurality of gate lines, wherein each of the pixel units includes four sub-pixel units; the first sub-pixel unit group includes two adjacent sub-pixel units, and the second sub-pixel unit group includes remaining two adjacent sub-pixel units; the first sub-pixel unit group and the second sub-pixel unit group are alternately arranged in both a row direction and a column direction; the data line connected with the two adjacent sub-pixel units included in the first sub-pixel unit group is
(Continued)

different from the data line connected with the two adjacent sub-pixel units included in the second sub-pixel unit group.

14 Claims, 3 Drawing Sheets

(51) Int. Cl.
    *G09G 3/36*     (2006.01)
    *G02F 1/1368*     (2006.01)

(52) U.S. Cl.
    CPC ........ *G02F 1/1368* (2013.01); *G02F 2201/52* (2013.01); *G09G 3/3614* (2013.01); *G09G 2300/0439* (2013.01); *G09G 2320/043* (2013.01)

(56) References Cited

U.S. PATENT DOCUMENTS

| | | |
|---|---|---|
| 2014/0036191 A1 | 2/2014 | Zhao et al. |
| 2014/0111410 A1 | 4/2014 | Guo |
| 2014/0125647 A1 | 5/2014 | Shin et al. |
| 2014/0152938 A1 | 6/2014 | Lee et al. |
| 2015/0029080 A1 | 1/2015 | Kwon et al. |
| 2015/0179121 A1 | 6/2015 | Lee |
| 2016/0155401 A1 | 6/2016 | Lee et al. |
| 2016/0267862 A1 | 9/2016 | Yao et al. |

FOREIGN PATENT DOCUMENTS

| | | |
|---|---|---|
| CN | 101866086 A | 10/2010 |
| CN | 102799036 A | 11/2012 |
| CN | 102819157 A | 12/2012 |
| CN | 103809313 A | 5/2014 |
| CN | 103852944 A | 6/2014 |
| CN | 104062820 A | 9/2014 |
| CN | 104730780 A | 6/2015 |
| CN | 105467704 A | 4/2016 |
| CN | 105652540 A | 6/2016 |
| CN | 106292110 A | 1/2017 |

OTHER PUBLICATIONS

Chinese Search Report dated Feb. 24, 2017; Appln. No. 201610849268.1.
The First Chinese Office Action dated Apr. 28, 2017; Appln. No. 201610849268.1.
The Second Chinese Office Action dated Jul. 19, 2017; Appln. No. 201610849268.1.
The Third Chinese Office Action dated Sep. 30, 2017; Appln. No. 201610849268.1.

* cited by examiner

PIXEL ARRAY, DISPLAY PANEL AND DISPLAY DEVICE

TECHNICAL FIELD

Embodiments of the present disclosure relate to a field of display technology, especially relate to a pixel array, a display panel and a display device.

BACKGROUND

Thin film transistor liquid crystal display (TFT-LCD) is a commonly used flat panel display. The liquid crystal display panel is widely used in modern digital information devices due to its small size, low power consumption, no radiation and high resolution. Dual-gate design is typically adopted in a conventional pixel array, and the source driving signal received by each data line is varied constantly, which makes power consumption and temperature of the source driving circuit increases. Meanwhile, when the source driving signal is varied, there would be a certain delay, and the effective signal time would be reduced, thereby the charging time of pixels would be shorten, resulting in the problem of insufficient charge of pixels, and then the problem of horizontal fine lines caused by the inconsistent charging states of pixels in odd and even rows.

SUMMARY

Embodiments of the present disclosure provide a pixel array, a display panel and a display device, so as to achieve a consistent charging state of each pixel in a monochrome frame of image, and prevent the occurrence of horizontal fine lines.

An embodiment of the present disclosure provides a pixel array, comprising: a plurality of pixel units arranged in an array, a plurality of data lines and a plurality of gate lines, wherein each of the pixel units comprises four sub-pixel units; in each pixel unit, four sub-pixel units are divided into a first sub-pixel unit group and a second sub-pixel unit group, the first sub-pixel unit group comprises two adjacent sub-pixel units, and the second sub-pixel unit group comprises remaining two adjacent sub-pixel units; the first sub-pixel unit group and the second sub-pixel unit group are alternately arranged in both a row direction and a column direction, the first sub-pixel unit group and the second sub-pixel unit group are respectively connected with one data line which is extended in the column direction; the two adjacent sub-pixel units comprised in the first sub-pixel unit group are connected with a same data line, the two adjacent sub-pixel units comprised in the second sub-pixel unit group are connected with a same data line, and the data line connected with the two adjacent sub-pixel units comprised in the first sub-pixel unit group is different from the data line connected with the two adjacent sub-pixel units comprised in the second sub-pixel unit group; and the two adjacent sub-pixel units comprised in the first sub-pixel unit group are respectively connected with two different gate lines, and the two adjacent sub-pixel units comprised in the second sub-pixel unit group are respectively connected with two different gate lines.

As an example, the gate lines comprise a first gate line and a second gate line, and the first gate line and the second gate line are both disposed between two adjacent rows of sub-pixel units; the two sub-pixel units comprised in the first sub-pixel unit group are respectively connected with the first gate line and the second gate line, and the two sub-pixel units comprised in the second sub-pixel unit group are respectively connected with the first gate line and the second gate line.

As an example, the gate lines comprise a first gate line and a second gate line, and the first gate line and the second gate line are respectively disposed at two opposite sides of each row of sub-pixel unit; the two sub-pixel units comprised in the first sub-pixel unit group are respectively connected with the first gate line and the second gate line, and the two sub-pixel units comprised in the second sub-pixel unit group are respectively connected with the first gate line and the second gate line.

As an example, in two adjacent first sub-pixel unit groups disposed in the row direction, the first sub-pixel unit comprised in one of the first sub-pixel unit groups is connected with the first gate line, the second sub-pixel unit comprised in the one of the first sub-pixel unit groups is connected with the second gate line; the first sub-pixel unit comprised in the other first sub-pixel unit group is connected with the second gate line, the second sub-pixel unit comprised in the other first sub-pixel unit group is connected with the first gate line; in two adjacent second sub-pixel unit groups disposed in the row direction, the first sub-pixel unit comprised in one of the second sub-pixel unit groups is connected with the first gate line, the second sub-pixel unit comprised in the one of the first sub-pixel unit groups is connected with the second gate line; the first sub-pixel unit comprised in the other second sub-pixel unit group is connected with the second gate line, the second sub-pixel unit comprised in the other second sub-pixel unit group is connected with the first gate line.

As an example, the first sub-pixel unit group comprises a red sub-pixel unit and a green sub-pixel unit, and the second sub-pixel unit group comprises a blue sub-pixel unit and a white sub-pixel unit; a number of red sub-pixel units connected with the first gate line is equal to a number of red sub-pixel units connected with the second gate line; a number of green sub-pixel units connected with the first gate line is equal to a number of green sub-pixel units connected with the second gate line; a number of blue sub-pixel units connected with the first gate line is equal to a number of blue sub-pixel units connected with the second gate line; a number of white sub-pixel units connected with the first gate line is equal to a number of white sub-pixel units connected with the second gate line.

As an example, the first sub-pixel unit group is connected with data lines disposed in odd-numbered columns, and the second sub-pixel unit group is connected with data lines disposed in even-numbered columns.

As an example, the first sub-pixel unit group is connected with data lines disposed in even-numbered columns, and the second sub-pixel unit group is connected with data lines disposed in odd-numbered columns.

As an example, each pixel unit comprises a red sub-pixel unit, a green sub-pixel unit, a blue sub-pixel unit and a white sub-pixel unit; or each pixel unit comprises a red sub-pixel unit, a green sub-pixel unit, a blue sub-pixel unit and a yellow sub-pixel unit.

As an example, the first sub-pixel unit group comprises the red sub-pixel unit and the green sub-pixel unit, and the second sub-pixel unit group comprises the blue sub-pixel unit and the white sub-pixel unit.

As an example, the first sub-pixel unit group comprises the red sub-pixel unit and the green sub-pixel unit, and the second sub-pixel unit group comprises the blue sub-pixel unit and the yellow sub-pixel unit.

An embodiment of the present disclosure provides a display panel, comprising: the above-mentioned pixel array.

An embodiment of the present disclosure provides a display device, comprising: the above-mentioned display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some of the embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
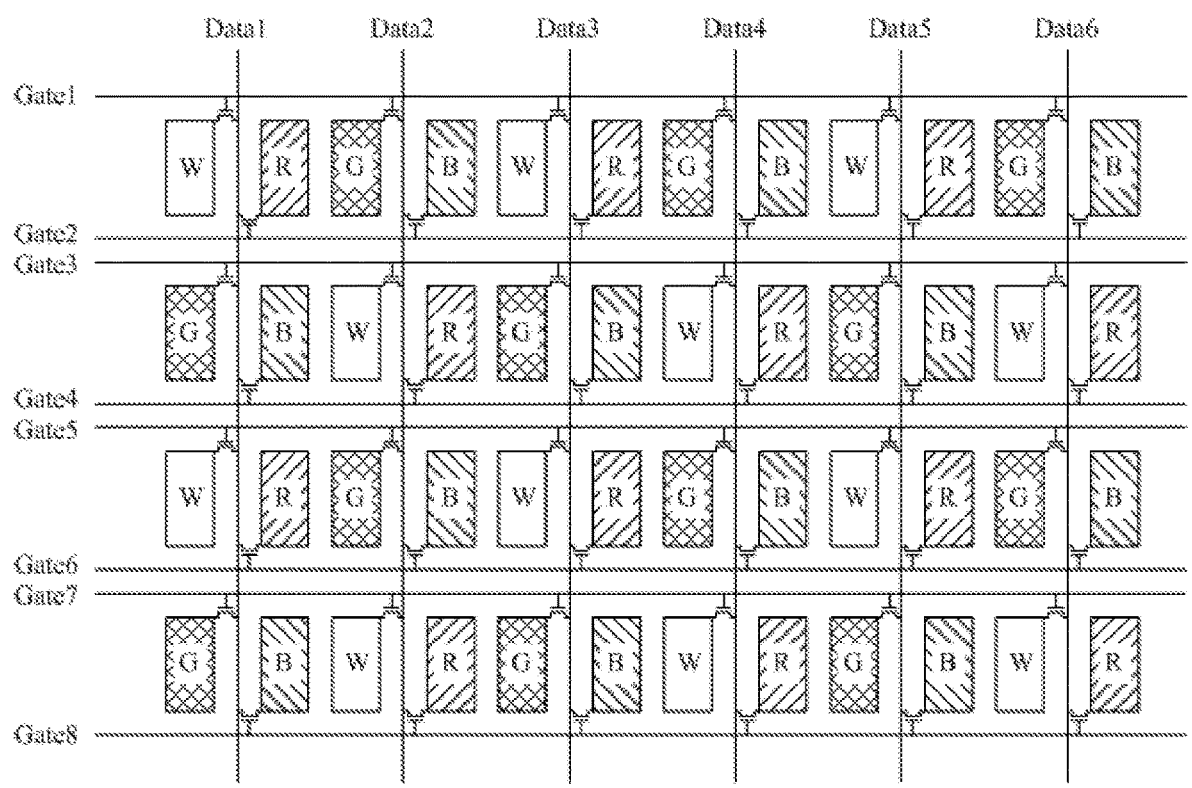
FIG. 1 schematically illustrates a pixel array.

FIG. 1 schematically illustrates a pixel array with a dual gate structure. As illustrated in FIG. 1, each pixel unit comprises four sub-pixel units of red (R), green (G), blue (B) and white (W), each gate line connected with a gate driving circuit is connected with a gate of TFT, and each data line connected with a source driving circuit is connected with a source of TFT. While the image is being displayed, a row of TFT gates is opened at the same time.

A two dot-inversion can be adopted in the pixel array illustrated in FIG. 1. For example, in Y frame image, the polarities of the data in two adjacent data lines are opposite to each other. For example, in Y+1 frame image, the polarity of the data in a data line is opposite to that of the data in the same data line in Y frame image, the polarities of the data in two adjacent data lines are opposite to each other, and the polarity of source driving signal received by each data line is varied between positive and negative alternately, that is, the polarities of the same data line in two adjacent frames of images are opposite to each other, in this way, the purpose of preventing the ageing of the liquid crystals can be achieved. For example, Y is an integer greater than or equal to one.

Embodiments of the present disclosure provide a pixel array, a display panel and a display device, so as to achieve a consistent charging state of each pixel in a monochrome frame of image, and avoid the occurrence of horizontal fine lines.

Figure 2:
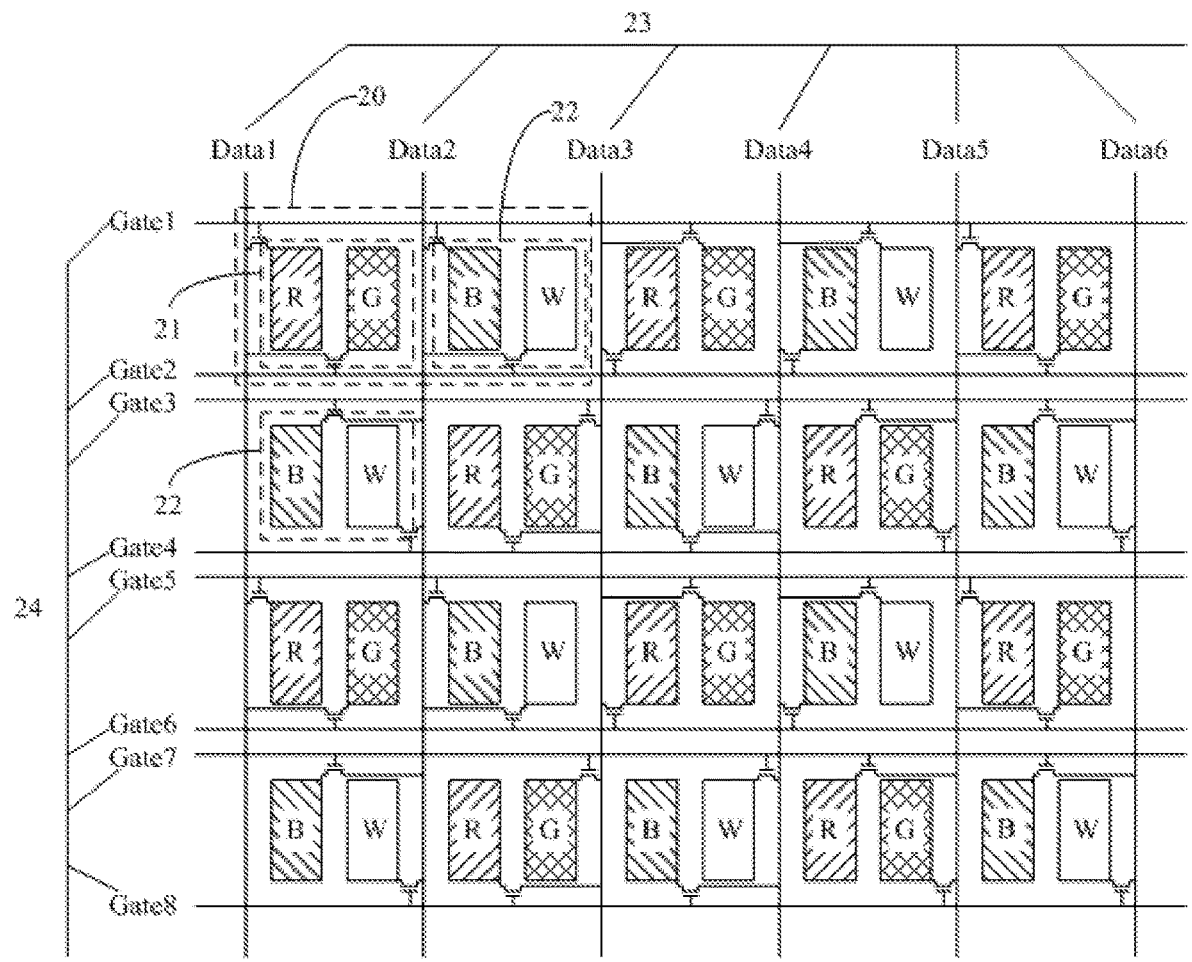
FIG. 2 schematically illustrates a pixel array according to an embodiment of the present disclosure.
Figure 3:
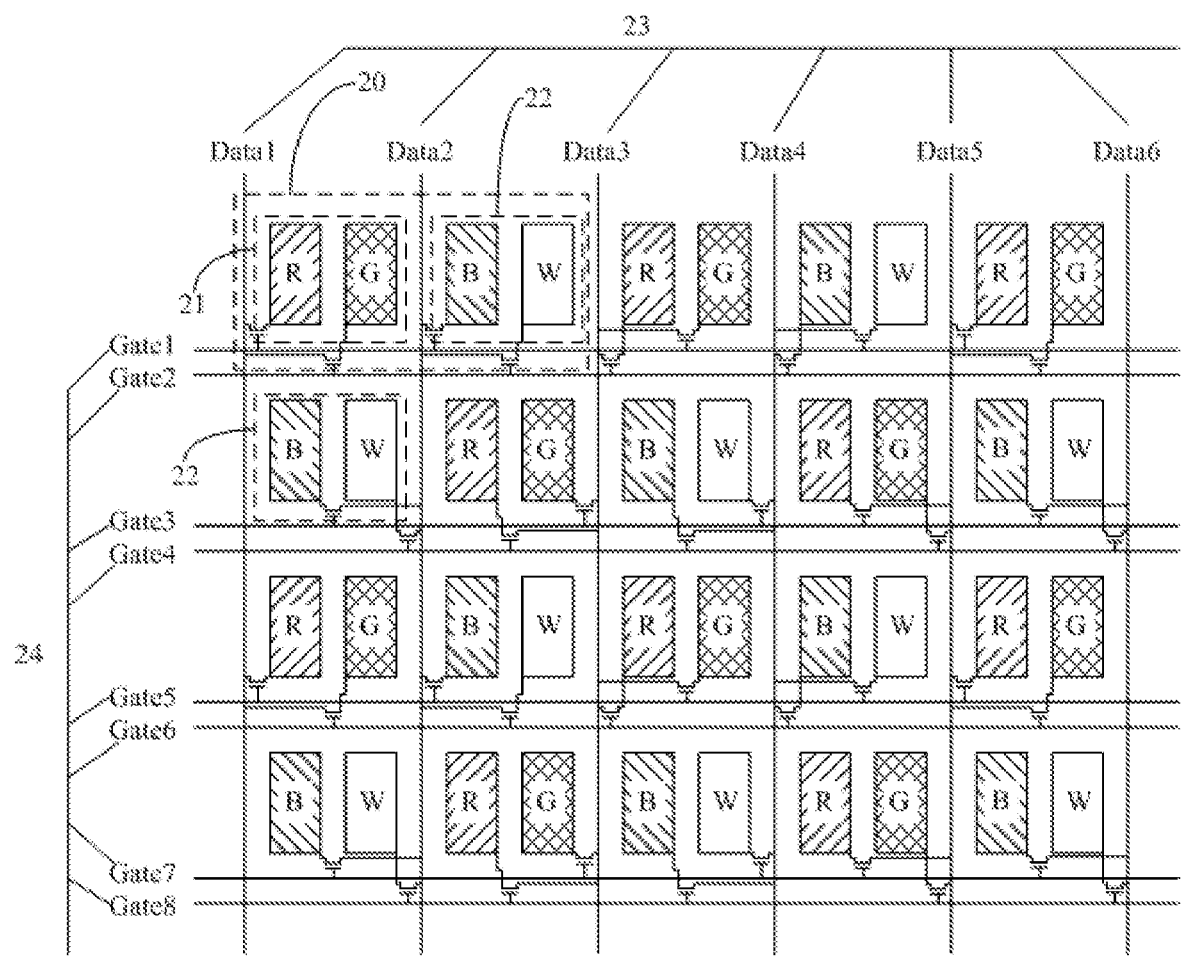
FIG. 3 schematically illustrates another pixel array according to an embodiment of the present disclosure.

As illustrated in FIGS. 2 and 3, an embodiment of the present disclosure provides a pixel array, which comprises: a plurality of pixel units 20 arranged in an array, a plurality of data lines 23 connected with a source driving circuit, such as Data1, Data2, Data3, Data4, Data5, Data6, etc., and a plurality of gate lines 24 connected with a gate driving circuit, such as Gate1, Gate2, Gate3, Gate4, Gate5, Gate6, Gate7, Gate8, etc., herein each of the pixel units 20 comprises four sub-pixel units.

In each pixel unit 20, four sub-pixel units are divided into a first sub-pixel unit group 21 and a second sub-pixel unit group 22. The first sub-pixel unit group 21 comprises two adjacent sub-pixel units, and the second sub-pixel unit group 22 comprises the remaining two adjacent sub-pixel units.

The first sub-pixel unit group 21 and the second sub-pixel unit group 22 are alternately arranged in both row direction and column direction, the first sub-pixel unit group 21 and the second sub-pixel unit group 22 are respectively connected with one data line, which is extended in the column direction.

As illustrated in FIG. 2, the two adjacent sub-pixel units comprised in the first sub-pixel unit group 21 are both connected with a same data line Data1, the two adjacent sub-pixel units comprised in the second sub-pixel unit group 22 are both connected with a same data line Data2, and the data line Data1 is different from the data line Data2.

The two adjacent sub-pixel units comprised in the first sub-pixel unit group 21 are respectively connected with two different gate lines 24, and the two adjacent sub-pixel units comprised in the second sub-pixel unit group 22 are respectively connected with two different gate lines 24. For example, as illustrated in FIG. 2, the two adjacent sub-pixel units comprised in the first sub-pixel unit group 21 are respectively connected with the gate lines Gate1 and Gate2; the two adjacent sub-pixel units comprised in the second sub-pixel unit group 22 are respectively connected with the gate lines Gate1 and Gate2.

For example, each pixel unit 20 comprises a red (R) sub-pixel unit, a green (G) sub-pixel unit, a blue (B) sub-pixel unit and a white (W) sub-pixel unit; or each pixel unit 20 comprises a R sub-pixel unit, a G sub-pixel unit, a B sub-pixel unit and a yellow (Y) sub-pixel unit, according to other embodiments of the present disclosure. In the embodiments of the present disclosure, the R sub-pixel unit, the G sub-pixel unit, the B sub-pixel unit and the W sub-pixel unit comprised in each pixel unit 20 are taken as an example. As illustrated in FIGS. 2 and 3, the transmittance of the RGBW product is higher, so the cost of the backlight source can be reduced.

In at least some of the embodiments, as illustrated in FIGS. 2 and 3, the first sub-pixel unit group 21 comprises a R sub-pixel unit and a G sub-pixel unit, the second sub-pixel unit group 22 comprises a B sub-pixel unit and a W sub-pixel unit; or the first sub-pixel unit group 21 comprises a R sub-pixel unit and a G sub-pixel unit, the second sub-pixel unit group 22 comprises a B sub-pixel unit and a Y sub-pixel unit.

In at least some of the embodiments, as illustrated in FIGS. 2 and 3, the first sub-pixel unit group 21 is connected with data lines disposed in odd-numbered columns, for example, the first sub-pixel unit group 21 is connected with data lines Data1, Data3, Data5 disposed in the first column, the third column and the fifth column respectively; the second sub-pixel unit group 22 is connected with data lines disposed in even-numbered columns, for example, the second sub-pixel unit group 22 is connected with data lines Data2, Data4, Data6 disposed in the second column, the fourth column and the sixth column respectively. It can be understood that in a specific design, the first sub-pixel unit group 21 may also be connected with data lines disposed in even-numbered columns, and the second sub-pixel unit group 22 may also be connected with data lines disposed in odd-numbered columns.

According to embodiments of the present disclosure, when two dot-inversion is performed in the pixel array, the polarities of source driving signal received by two adjacent data lines 23 are opposite to each other in the same frame image; the polarities of source driving signal received by the same one data line 23 are the same in two adjacent frame images. Compared with the prior art, the polarity of source driving signal received by each data line does not need to vary alternately between positive and negative, that is, the source driving signal is stable and alternating variation is not necessary in embodiments of the present disclosure, therefore, it is possible to avoid the problems that the power consumption and the temperature of the source driving circuit are increased; additionally, since the polarity of source driving signal does not need to vary alternately between positive and negative, a consistent charging state of each pixel in a monochrome frame of image can be achieved, and the occurrence of horizontal fine lines can be prevented.

Two different wire arrangement examples of gate lines in a dual-gate design are described in detail below with reference to the drawings according to embodiments of the present disclosure.

As illustrated in FIG. 2, according to embodiments of the present disclosure, the gate lines 24 comprise a first gate line and a second gate line; according to embodiments of the present disclosure, the gate lines disposed in odd-numbered rows serve as the first gate line, such as Gate1, Gate3, Gate5 and Gate7, etc., the gate lines disposed in even-numbered rows serve as the second gate line, such as Gate2, Gate4, Gate6 and Gate8, etc. The first gate line and the second gate line are respectively disposed at two opposite sides of each row of sub-pixel unit. According to embodiments of the present disclosure, the two sub-pixel units comprised in the first sub-pixel unit group 21 are respectively connected with the first gate line and the second gate line, the two sub-pixel units comprised in the second sub-pixel unit group 22 are respectively connected with the first gate line and the second gate line.

For example, according to embodiments of the present disclosure, in two adjacent first sub-pixel unit groups 21 disposed along a row direction, the first sub-pixel unit comprised in one of the first sub-pixel unit groups 21 is connected with the first gate line, the second sub-pixel unit comprised in the one of first sub-pixel unit groups 21 is connected with the second gate line; the first sub-pixel unit comprised in the other first sub-pixel unit group 21 is connected with the second gate line, the second sub-pixel unit comprised in the other first sub-pixel unit group 21 is connected with the first gate line. For example, in the two adjacent first sub-pixel unit groups 21 disposed in the first row, R sub-pixel unit comprised in the first sub-pixel unit group 21 of the first column is connected with the first gate line Gate1, G sub-pixel unit is connected with the second gate line Gate2; R sub-pixel unit comprised in the first sub-pixel unit group 21 of the third column is connected with the second gate line Gate2, G sub-pixel unit is connected with the first gate line Gate1. In the specific wire arrangement design of the pixel array, the resistance of the wire is substantially same in entire pixel array, thus, there is no abnormality caused by the high power consumption in local area of the pixel array due to inconsistent wires length.

For example, in two adjacent second sub-pixel unit groups 22 disposed along a row direction, the first sub-pixel unit comprised in one of the second sub-pixel unit groups 22 is connected with the first gate line, the second sub-pixel unit comprised in the one of the first sub-pixel unit groups 22 is connected with the second gate line; the first sub-pixel unit comprised in the other second sub-pixel unit group 22 is connected with the second gate line, the second sub-pixel unit comprised in the other second sub-pixel unit group 22 is connected with the first gate line. For example, in the two adjacent second sub-pixel unit groups 22 disposed in the first row, B sub-pixel unit comprised in the second sub-pixel unit group 22 of the second column is connected with the first gate line Gate1, W sub-pixel unit is connected with the second gate line Gate2; B sub-pixel unit comprised in the second sub-pixel unit group 22 of the fourth column is connected with the second gate line Gate2, W sub-pixel unit is connected with the first gate line Gate1. In the specific wire arrangement design of the pixel array, the resistance of the wire is substantially same in entire pixel array, thus, the power consumption is substantially same in entire pixel array, and the performance of the pixel array is improved.

In at least some of the embodiments, as illustrated in FIG. 2, according to embodiments of the present disclosure, for all R sub-pixel units, the number of R sub-pixel units connected with the first gate line is equal to the number of R sub-pixel units connected with the second gate line; for all G sub-pixel units, the number of G sub-pixel units connected with the first gate line is equal to the number of G sub-pixel units connected with the second gate line; for all B sub-pixel units, the number of B sub-pixel units connected with the first gate line is equal to the number of B sub-pixel units connected with the second gate line; for all W sub-pixel units, the number of W sub-pixel units connected with the first gate line is equal to the number of W sub-pixel units connected with the second gate line.

As illustrated in FIG. 3, according to embodiments of the present disclosure, the gate lines 24 comprise a first gate line and a second gate line, the gate lines disposed in odd-numbered rows serve as the first gate line, such as Gate1, Gate3, Gate5 and Gate7, etc., the gate lines disposed in even-numbered rows serve as the second gate line, such as Gate2, Gate4, Gate6 and Gate8, etc., and the first gate line and the second gate line are both disposed between two adjacent rows of sub-pixel units. The two sub-pixel units comprised in the first sub-pixel unit group 21 are respectively connected with the first gate line and the second gate line, and the two sub-pixel units comprised in the second sub-pixel unit group 22 are respectively connected with the first gate line and the second gate line.

As illustrated in FIG. 2, only one gate line Gate1 is disposed above the first row of sub-pixels; as illustrated in FIG. 3, the gate line Gate1 is disposed between the first and second rows of sub-pixel units, and there is no gate line disposed above the first row of sub-pixels.

An embodiment of the present disclosure further provides a display panel, which comprises the above pixel array. The pixel array provided in above embodiments can be applied in an array substrate, a color filter substrate or a color-filter on array (COA) substrate.

An embodiment of the present disclosure further provides a display device, which comprises the above display panel. The display panel may be a liquid crystal panel, a liquid crystal display, a liquid crystal television, an organic light emitting diode (OLED) panel, an OLED display, an OLED television or an electronic paper etc.

What is described above is related to the illustrative embodiments of the disclosure only and not limitative to the scope of the disclosure; the scopes of the disclosure are defined by the accompanying claims.

The present application claims the priority of Chinese patent application No. 201610849268.1 filed on Sep. 23, 2016, the disclosure of which is incorporated herein by reference in its entirety.

The invention claimed is:

1. pixel array, comprising: a plurality of pixel units arranged in an array, a plurality of data lines and a plurality of gate lines,
wherein each of the pixel units comprises four sub-pixel units;
in each pixel unit, four sub-pixel units are divided into a first sub-pixel unit group and a second sub-pixel unit group, the first sub-pixel unit group comprises two adjacent sub-pixel units, and the second sub-pixel unit group comprises remaining two adjacent sub-pixel units;
the first sub-pixel unit groups and the second sub-pixel unit groups of the plurality of pixel units are alternately arranged in both a row direction and a column direction, the first sub-pixel unit group and the second sub-pixel unit group are respectively connected with one data line which is extended in the column direction;
the two adjacent sub-pixel units comprised in the first sub-pixel unit group are connected with a same data line, the two adjacent sub-pixel units comprised in the second sub-pixel unit group are connected with a same data line, and the data line connected with the two adjacent sub-pixel units comprised in the first sub-pixel unit group is different from the data line connected with the two adjacent sub-pixel units comprised in the second sub-pixel unit group;
the two adjacent sub-pixel units comprised in the first sub-pixel unit group are respectively connected with two different gate lines, and the two adjacent sub-pixel units comprised in the second sub-pixel unit group are respectively connected with two different gate lines;
the first sub-pixel unit group comprises a red sub-pixel unit and a green sub-pixel unit, and the second sub-pixel unit group comprises a blue sub-pixel unit and a white sub-pixel unit;
a number of red sub-pixel units connected with the first gate line is equal to a number of red sub-pixel units connected with the second gate line;
a number of green sub-pixel units connected with the first gate line is equal to a number of green sub-pixel units connected with the second gate line;
a number of blue sub-pixel units connected with the first gate line is equal to a number of blue sub-pixel units connected with the second gate line; and
a number of white sub-pixel units connected with the first gate line is equal to a number of white sub-pixel units connected with the second gate line.

2. The pixel array according to claim 1, wherein the first sub-pixel unit group is connected with data lines disposed in odd-numbered columns, and the second sub-pixel unit group is connected with data lines disposed in even-numbered columns.

3. The pixel array according to claim 1, wherein the first sub-pixel unit group is connected with data lines disposed in even-numbered columns, and the second sub-pixel unit group is connected with data lines disposed in odd-numbered columns.

4. The pixel array according to claim 1, wherein each pixel unit comprises a red sub-pixel unit, a green sub-pixel unit, a blue sub-pixel unit and a white sub-pixel unit; or
each pixel unit comprises a red sub-pixel unit, a green sub-pixel unit, a blue sub-pixel unit and a yellow sub-pixel unit.

5. The pixel array according to claim 4, wherein the first sub-pixel unit group comprises the red sub-pixel unit and the green sub-pixel unit, and the second sub-pixel unit group comprises the blue sub-pixel unit and the white sub-pixel unit.

6. The pixel array according to claim 4, wherein the first sub-pixel unit group comprises the red sub-pixel unit and the green sub-pixel unit, and the second sub-pixel unit group comprises the blue sub-pixel unit and the yellow sub-pixel unit.

7. A display panel, comprising: the pixel array according to claim 1.

8. A display device, comprising: the display panel according to claim 7.

9. The pixel array according to claim 1, wherein in two adjacent first sub-pixel unit groups disposed in the row direction, the first sub-pixel unit comprised in one of the first sub-pixel unit groups is connected with the first gate line, the second sub-pixel unit comprised in the one of the first sub-pixel unit groups is connected with the second gate line; the first sub-pixel unit comprised in the other first sub-pixel unit group is connected with the second gate line, the second sub-pixel unit comprised in the other first sub-pixel unit group is connected with the first gate line;
wherein in two adjacent second sub-pixel unit groups disposed in the row direction, the first sub-pixel unit comprised in one of the second sub-pixel unit groups is connected with the first gate line, the second sub-pixel unit comprised in the one of the first sub-pixel unit groups is connected with the second gate line; the first sub-pixel unit comprised in the other second sub-pixel unit group is connected with the second gate line, the second sub-pixel unit comprised in the other second sub-pixel unit group is connected with the first gate line.

10. The pixel array according to claim 1, wherein the gate lines comprise a first gate line and a second gate line, and the first gate line and the second gate line are respectively disposed at two opposite sides of each row of sub-pixel unit;
each of the first sub-pixel unit groups comprises a first sub-pixel and a second sub-pixel, and the first sub-pixel unit groups have same one order in arranging the first sub-pixel and the second sub-pixel;
each of the second sub-pixel unit groups comprises a third sub-pixel and a fourth sub-pixel, and the second sub-pixel unit groups have same one order in arranging the third sub-pixel and the fourth sub-pixel;
in two adjacent first sub-pixel unit groups disposed in the row direction, a first sub-pixel unit comprised in one of the first sub-pixel unit groups is connected with the first gate line, a second sub-pixel unit comprised in the one of the first sub-pixel unit groups is connected with the second gate line; a first sub-pixel unit comprised in the other first sub-pixel unit group is connected with the second gate line, a second sub-pixel unit comprised in the other first sub-pixel unit group is connected with the first gate line;

in two adjacent second sub-pixel unit groups disposed in the row direction, a third sub-pixel comprised in one of the second sub-pixel unit groups is connected with the first gate line, a fourth sub-pixel comprised in the one of the first sub-pixel unit groups is connected with the second gate line; a third sub-pixel comprised in the other second sub-pixel unit group is connected with the second gate line, a fourth sub-pixel comprised in the other second sub-pixel unit group is connected with the first gate line.

11. The pixel array according to claim 1, wherein the gate lines comprise a first gate line and a second gate line, and the first gate line and the second gate line are both disposed between two adjacent rows of sub-pixel units;

the two sub-pixel units comprised in the first sub-pixel unit group are respectively connected with the first gate line and the second gate line, and the two sub-pixel units comprised in the second sub-pixel unit group are respectively connected with the first gate line and the second gate line.

12. The pixel array according to claim 11, wherein in two adjacent first sub-pixel unit groups disposed in the row direction, the first sub-pixel unit comprised in one of the first sub-pixel unit groups is connected with the first gate line, the second sub-pixel unit comprised in the one of the first sub-pixel unit groups is connected with the second gate line; the first sub-pixel unit comprised in the other first sub-pixel unit group is connected with the second gate line, the second sub-pixel unit comprised in the other first sub-pixel unit group is connected with the first gate line;

in two adjacent second sub-pixel unit groups disposed in the row direction, the first sub-pixel unit comprised in one of the second sub-pixel unit groups is connected with the first gate line, the second sub-pixel unit comprised in the one of the first sub-pixel unit groups is connected with the second gate line; the first sub-pixel unit comprised in the other second sub-pixel unit group is connected with the second gate line, the second sub-pixel unit comprised in the other second sub-pixel unit group is connected with the first gate line.

13. The pixel array according to claim 1, wherein the gate lines comprise a first gate line and a second gate line, and the first gate line and the second gate line are respectively disposed at two opposite sides of each row of sub-pixel unit;

the two sub-pixel units comprised in the first sub-pixel unit group are respectively connected with the first gate line and the second gate line, and the two sub-pixel units comprised in the second sub-pixel unit group are respectively connected with the first gate line and the second gate line.

14. A pixel array, comprising: a plurality of pixel units arranged in an array, a plurality of data lines and a plurality of gate lines, wherein each of the pixel units comprises four sub-pixel units;

in each pixel unit, four sub-pixel units are divided into a first sub-pixel unit group and a second sub-pixel unit group, the first sub-pixel unit group comprises two adjacent sub-pixel units, and the second sub-pixel unit group comprises remaining two adjacent sub-pixel units;

the first sub-pixel unit groups and the second sub-pixel unit groups of the plurality of pixel units are alternately arranged in both a row direction and a column direction, the first sub-pixel unit group and the second sub-pixel unit group are respectively connected with one data line which is extended in the column direction;

the two adjacent sub-pixel units comprised in the first sub-pixel unit group are connected with a same data line, the two adjacent sub-pixel units comprised in the second sub-pixel unit group are connected with a same data line, and the data line connected with the two adjacent sub-pixel units comprised in the first sub-pixel unit group is different from the data line connected with the two adjacent sub-pixel units comprised in the second sub-pixel unit group;

the two adjacent sub-pixel units comprised in the first sub-pixel unit group are located on same one side of a data line that is connected with the two adjacent sub-pixel units comprised in the first sub-pixel unit group;

the two adjacent sub-pixel units comprised in the first sub-pixel unit group are located on same one side of a data line that is connected with the two adjacent sub-pixel units comprised in the second sub-pixel unit group; and the two adjacent sub-pixel units comprised in the first sub-pixel unit group are respectively connected with two different gate lines, and the two adjacent sub-pixel units comprised in the second sub-pixel unit group are respectively connected with two different gate lines.

* * * * *